United States Patent
Wang et al.

(10) Patent No.: US 6,797,650 B1
(45) Date of Patent: Sep. 28, 2004

(54) FLASH MEMORY DEVICES WITH OXYNITRIDE DIELECTRIC AS THE CHARGE STORAGE MEDIA

(75) Inventors: Zhigang Wang, Santa Clara, CA (US); Nian Yang, San Jose, CA (US); John Jianshi Wang, San Jose, CA (US); Jiang Li, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/342,032

(22) Filed: Jan. 14, 2003

(51) Int. Cl.[7] .............................................. H01L 21/31
(52) U.S. Cl. ...................................... 438/786; 438/769
(58) Field of Search ................................ 438/769, 786

(56) References Cited

U.S. PATENT DOCUMENTS

| | | | |
|---|---|---|---|
| 4,725,560 A | * | 2/1988 | Abernathey et al. ........ 438/394 |
| 4,871,689 A | * | 10/1989 | Bergami et al. ............ 438/427 |
| 5,455,204 A | | 10/1995 | Dobuzinsky et al. |
| 5,455,453 A | * | 10/1995 | Harada et al. .............. 257/675 |
| 5,656,837 A | | 8/1997 | Lancaster et al. |
| 5,768,192 A | | 6/1998 | Eitan |
| 5,789,776 A | | 8/1998 | Lancaster et al. |
| 6,171,947 B1 | * | 1/2001 | Pangrle et al. .............. 438/624 |
| 6,440,797 B1 | * | 8/2002 | Wu et al. .................... 438/261 |
| 6,445,030 B1 | | 9/2002 | Wu et al. |
| 6,465,303 B1 | | 10/2002 | Ramsbey et al. |
| 6,465,306 B1 | | 10/2002 | Ramsbey et al. |
| 2002/0019085 A1 | * | 2/2002 | Chen et al. ................. 438/197 |

* cited by examiner

Primary Examiner—Allan R. Wilson
(74) Attorney, Agent, or Firm—Eschweiler & Associates, LLC

(57) ABSTRACT

One aspect of the invention relates to flash memory device that stores charge in a substantially stoichiometric silicon oxynitride dielectric. A stoichiometric silicon oxynitride dielectric can be represented by the formula $(Si_3N_4)_x(SiO_2)_{(1-x)}$, where x is from 0–1. A substantially stoichiometric silicon oxynitride dielectric has relatively few atoms that do not fit into the foregoing formula. The flash memory devices of the present invention have fewer defects and lower leakage than comparable SONOS-type flash memory devices. Another aspect of the invention relates to assessing the stoichiometry by FTIR, refractive index measurement, or a combination of the two.

22 Claims, 4 Drawing Sheets

FLASH MEMORY DEVICES WITH OXYNITRIDE DIELECTRIC AS THE CHARGE STORAGE MEDIA

TECHNICAL FIELD OF THE INVENTION

The present invention relates generally to semiconductor devices and more particularly to flash memory.

BACKGROUND OF THE INVENTION

There has long been a demand for small, portable personal devices. These devices include cellular phones, personal computing equipment, and personal sound systems, which are sought in continuously smaller sizes and with continuously lower power requirements. At the same time that smaller and more portable devices are sought, computational power and on-chip memory requirements are increasing. In light of these requirements, there has been a long-felt need for computational devices that have substantial memory and logic functions integrated within individual semiconductor chips. Preferably, the memory is configured such that if power is interrupted, as when a battery fails, the contents of the memory are retained. Memory that retains its content without a continuous supply of power is called non-volatile memory. Non-volatile memory types include, for example, electrically erasable, programmable read only memory (EEPPROM) and flash EEPROM. The term "flash" refers to the ability of the memory to be erased in blocks. Flash memory devices store electrical charge, representing data, in transistors having either a floating gate or a charge-trapping dielectric.

Conventional flash memory uses a floating gate. A floating gate memory cell characteristically includes a vertical stack of a tunnel oxide, a first polysilicon layer (the floating gate), an ONO tri-layer (silicon oxide, silicon nitride, silicon oxide) interlevel dielectric, and a second polysilicon layer (control gate) over the interlevel dielectric. Thus, the conductive floating gate is sandwiched between two dielectrics.

A floating gate memory cell can be programmed by inducing hot electron injection from a portion of the substrate, such as the channel near a drain region, to the floating gate. Typically, a source region and a bulk portion of the substrate are grounded while a relatively high positive voltage is applied to the control gate. A moderate positive voltage is applied to the drain region causing electrons to flow from source to drain. Near the drain, "hot" (high energy) electrons form and are attracted into the floating gate by the electric field from the control gate. After sufficient negative charge accumulates in the floating gate, the floating gate raises the threshold voltage of the memory cell and inhibits current flow through the channel region during subsequent "read" operations. The magnitude of the current when read voltages are applied to the gates is used to determine whether or not a flash memory cell is programmed.

The act of discharging a flash memory cell is called the erase function. For a floating gate memory cell, the erase function is typically carried out by inducing Fowler-Nordheim tunneling between the floating gate and the source region of the transistor (source erase or negative gate erase) or between the floating gate and the substrate (channel erase). A source erase operation is induced by applying a high positive voltage to the source region and a 0 V to the control gate and the substrate while floating the drain region.

An alternative to floating gate flash memory is SONOS-type flash memory. SONOS-type flash memory cells are constructed with a charge trapping dielectric layer, typically a silicon nitride layer, separated from the channel by a tunnel oxide, typically silicon dioxide. A control gate layer is formed over the charge trapping layer, and is optionally separated from the charge trapping layer by another dielectric layer, also typically silicon dioxide. The charge trapping layer holds charge, which represents data. Electrical charge is trapped within the layer locally near whichever side of the transistor is used as a drain in programming the cell. By reading in the opposite direction of programming, the presence or absence of charge at either side can be separately detected, whereby two bits of data can be stored per cell. Thus, a SONOS-type cell can be described as a two-transistor cell, or two-bit per cell architecture. If multi-level is used, then four or more bits per cell can be stored.

Storing two or more bits per cell provides a way of achieving high memory density.

Both bits of a SONOS-type memory cell are programmed in a conventional manner, such as hot electron programming. The right bit can be programmed by applying programming voltages to the gate and the drain while the source is grounded or at a lower voltage. Hot electrons are accelerated sufficiently so that they are injected into a region of the charge trapping dielectric layer near the drain. To read the device in the opposite direction from which it is written, voltages are applied to the gate and the source while the drain is grounded or at a lower voltage. The left bit is similarly programmed and read by swapping the functionality of source and drain terminals. Programming and reading one of the bits generally leaves the other bit with its information intact.

Reading in the reverse direction is most effective when relatively low gate voltages are used. A benefit of utilizing relatively low gate voltages in combination with reading in the reverse direction is that a relatively small trapped charge region, which affects the potential in the channel only beneath that region, is sufficient to significantly alter the potential drop needed for current to flow through the channel. Less charge needs to be stored, which permits much shorter programming times.

SONOS-type memory devices offer additional advantages as well. In particular, the erase mechanism of the memory cell is greatly enhanced. Both bits of the memory cell can be erased by applying suitable erase voltages to the gate and the drain for the right bit and to the gate and the source for the left bit. Another advantage is that SONOS-type memory cells undergo less wear from cycling and thus have greater longevity.

A potential disadvantage of SONOS-type memory is the length of time over which SONOS-type memory holds charge without power. In a typical SONOS-type memory cell, charge is gradually lost, most likely through pinhole defects in the silicon nitride film. There is an unsatisfied need for flash memory that has high density and can hold charge over more extended periods of time without power.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

One aspect of the invention relates to flash memory devices that store charge in a substantially stoichiometric silicon oxynitride dielectric. A stoichiometric silicon oxynitride dielectric can be represented by the formula $(Si_3N_4)x$ $(SiO_2)_{(1-x)}$, where x is from 0–1. A substantially stoichiometric silicon oxynitride dielectric has relatively few atoms that do not fit into the foregoing formula. The flash memory devices of the present invention have fewer defects and lower leakage than comparable SONOS-type flash memory devices.

Another aspect of the invention relates to a process of forming a substantially stoichiometric silicon oxynitride layer for a flash memory device. The process involves assessing the stoichiometry and adjusting process conditions as needed to improve stoichiometry. In one embodiment, the stoichiometry is assessed from an FTIR spectrum. In another embodiment, the stoichiometry is assessed by measuring the refractive index at two or more wavelengths.

Other advantages and novel features of the invention will become apparent from the following detailed description of the invention and the accompanying drawings. The detailed description of the invention and drawings provide exemplary embodiments of the invention. These exemplary embodiments are indicative of but a few of the various ways in which the principles of the invention can be employed.

DETAILED DESCRIPTION OF THE INVENTION

Figure 1:
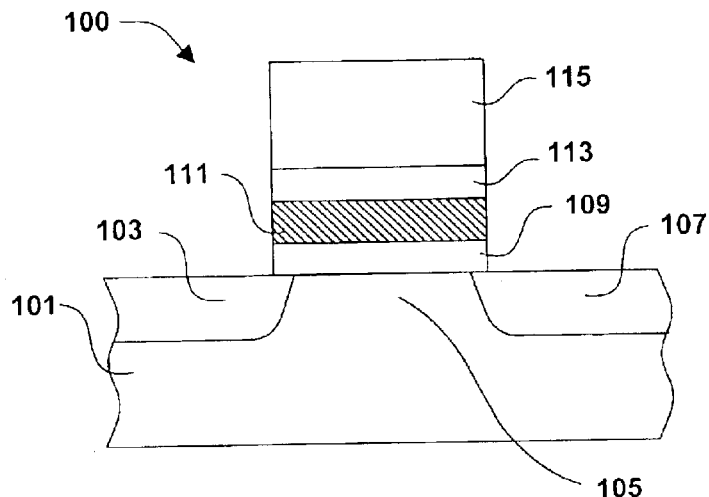
FIG. 1 is a schematic illustration of SONOS-type memory cell.

The present invention will now be described with reference to the drawings. FIG. 1 is a schematic illustration of SONOS-type memory cell 100 according to one aspect of the present invention. Memory cell 100 includes a substrate 101, in which is formed a first source/drain region 103, a channel region 105, and a second source/drain region 107. Over the substrate are formed a tunnel oxide 109, a silicon oxynitride charge trapping dielectric 111, an optional interlevel dielectric 113, and a control gate 115.

The substrate 101 comprises a semiconductor, typically silicon. Other examples of semiconductors include GaAs and InP. In addition to a semiconductor, the substrate may include various elements therein and/or layers thereon. These can include metal layers, barrier layers, dielectric layers, device structures, silicon gates, word lines, source regions, drain regions, bit lines, conductive lines, and conductive vias.

The first and second source/drain regions, 103 and 107, and the channel region 105, are generally formed by ion implantation of dopants into the substrate 101. The channel can be doped either p-type or n-type, but is typically p-type. The source/drain regions 103 and 107 are doped to an opposite conductivity type.

The tunnel oxide 109 is formed over the channel region. The thickness of the tunnel oxide depends in part on the size of the memory cells being formed, the thickness being less when smaller memory cells are desired. In one embodiment, the tunnel oxide is about 30 Angstroms to about 150 Angstroms thick. In another embodiment, the tunnel oxide is about 80 Angstroms to about 120 Angstroms thick. In a further embodiment, the tunnel oxide is about 100 Angstroms thick.

The term tunnel oxide has a functional definition according to its role as an insulating layer between the channel and the charge trapping dielectric. Generally a tunnel oxide is an oxide and is formed by oxidizing a silicon semiconductor surface. In general, however, the tunnel oxide can be any suitable insulating layer, including for example, a silicon rich silicon dioxide, an oxygen rich silicon dioxide, or a high-k dielectric.

Generally, the silicon oxynitride charge trapping dielectric 111 is sandwiched between the tunnel oxide 109 and an interlevel dielectric layer 113. However, the interlevel dielectric layer 113 is optional. Where the interlevel dielectric layer 113 is provided, it is generally a CVD deposited silicon dioxide or similar layer and can have a thickness comparable to that of the tunnel oxide layer 109.

The control gate 115 is generally a polysilicon layer and may also form part of a word line. The control gate is typically several thousand Angstroms thick. The silicon oxynitride charge trapping dielectric 113 can be of any suitable thickness. A somewhat thicker silicon oxynitride film may be required to achieve the same performance as a pure silicon nitride film. In one embodiment, the silicon oxynitride is about 75 Angstroms to about 300 Angstroms thick. In another embodiment, the silicon oxynitride is about 100 Angstroms to about 225 Angstroms thick. In a further embodiment, the silicon oxynitride is about 110 Angstroms to about 150 Angstroms thick.

The silicon oxynitride charge trapping dielectric 113 can contain any suitable silicon oxide to silicon nitride ratio. In one embodiment, the dielectric layer 113 is from about 20 to about 95% silicon nitride on a mole basis. In another embodiment it is from about 40 to about 90% silicon nitride. In a further embodiment, it is from about 60 to about 80% silicon nitride. It has been appreciated by the inventors of the present invention that the silicon oxynitride dielectric 113 has fewer intrinsic defects then a pure silicon nitride dielectric, and is expected to hold charge for longer periods of time, thereby improving device reliability.

The silicon oxynitride charge trapping dielectric 113 can be further characterized as being a substantially stoichiometric combination of silicon oxide and silicon nitride. A substantially stoichiometric combination has a ratio of atoms substantially in accordance with the formula $(Si_3N_4)_x(SiO_2)_{(1-x)}$, where x is from 0–1.

Silicon oxynitride films formed without measuring the stoichiometry of films and correcting process conditions accordingly are generally not stoichiometric. It has been appreciated by the inventors of the present invention that a silicon oxynitride film that is substantially stoichiometric advantageously has fewer defects than a silicon oxynitride film that is not and holds charge longer.

A substantially stoichiometric silicon oxynitride film can be represented by the formula $\zeta_y((Si_3N_4)_x(SiO_2)_{(1-x)})_{1-y}$, where y is minimized and $\zeta$ represents all atoms that cannot be fit to the formula $(Si_3N_4)_x(SiO_2)_{(1-x)}$. In one embodiment, y is about 0.3 or less. In another embodiment, y is about 0.1 or less. In a further embodiment, y is about 0.05 or less.

Figure 2:
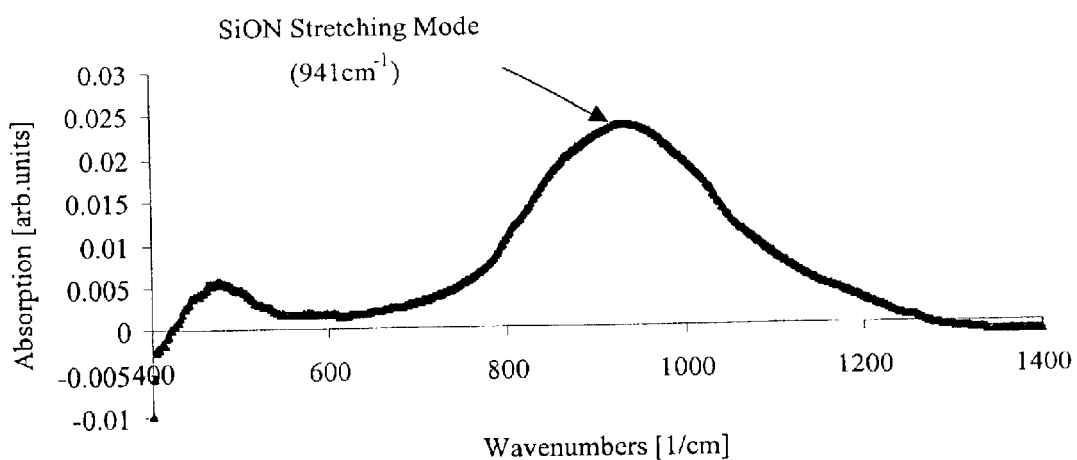
FIG. 2 is an FTIR spectrum of a silicone oxynitride film.

According to another aspect of the invention, the substantially stoichiometric silicon oxynitride film is characterized by a low ratio of Si—H and N—H bonds to Si—O and Si—N bonds. FIG. 2 provides a the FTIR (Fourier transform infra-red) spectrum of a silicon oxynitride film. The relatively large peak around 900 results from Si—O and Si—N bonds. The relatively small peak around 450 results from Si—H bonds. If there were a significant number of N—H bonds, there would be another peak around 1300. Without process control, there is generally a moderate sized peak either at 450 (Si—H) or 1300 (N—H).

The ratio of the areas under the Si—H and the N—H peaks to the area under the Si—(O,N) peak can be used to approximate the ratio of Si—H and N—H bonds to Si—O and Si—N bonds. In one embodiment, this ratio is about 1:15 or less. In another embodiment, it is about 1:40 or less. In a further embodiment, it is about 1:100 or less.

Figure 3:
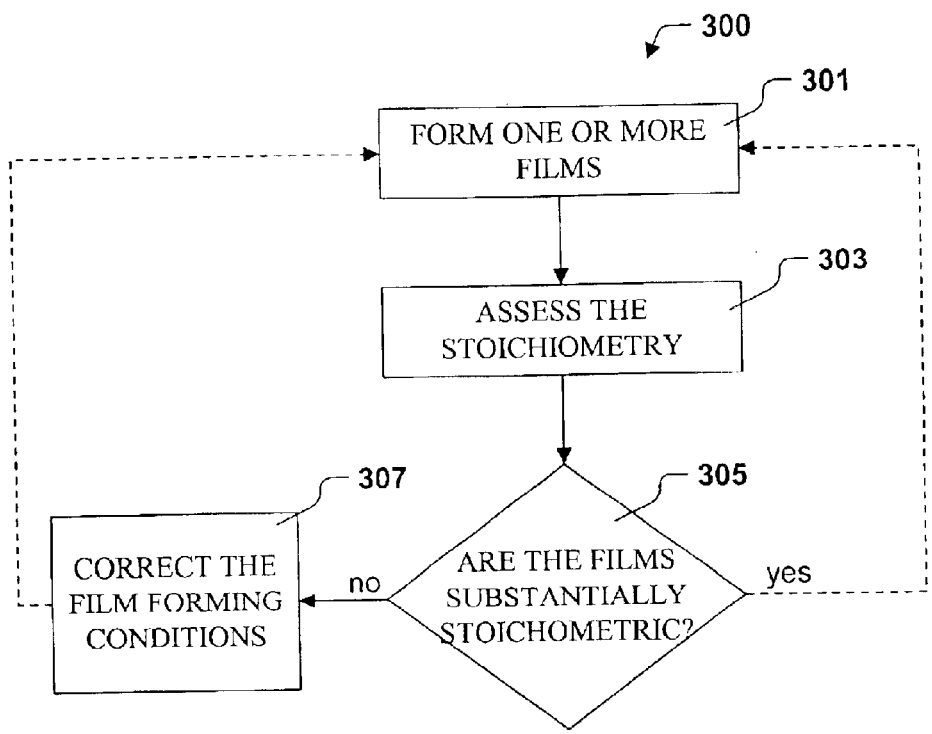
FIG. 3 is a flow chart of a process according to one aspect of the present invention.

FIG. 3 illustrates a process 300 according to a further aspect of the invention for obtaining a substantially stoichiometric silicon oxynitride film. Process 300 can be a development process, used to find conditions that are applied to many batches without change, or a type of process control, used to continuously modify conditions from batch to batch. Although the method 300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the method according to the present invention may be implemented in association with the apparatus and systems illustrated and described herein as well as in association with other apparatus or systems not illustrated.

Process 301 includes forming a film (or series of films), act 301, assessing the stoichiometry obtained, act 303, determining whether the films are substantially stoichiometric, act 305, and selectively correcting process conditions as needed with act 307.

While not strictly required, process 300 can, and generally does, incorporate actions for obtaining a film with a desirable silicon oxide to silicon nitride ratio. In particular, when the stoichiometry of the film is assessed with act 303, the oxide to nitride ratio is generally also assessed. The film forming conditions are corrected in act 307, as necessary, to achieve a desired silicon oxide to silicon nitride ratio as well as to achieve a substantially stoichiometric film.

Figure 4:
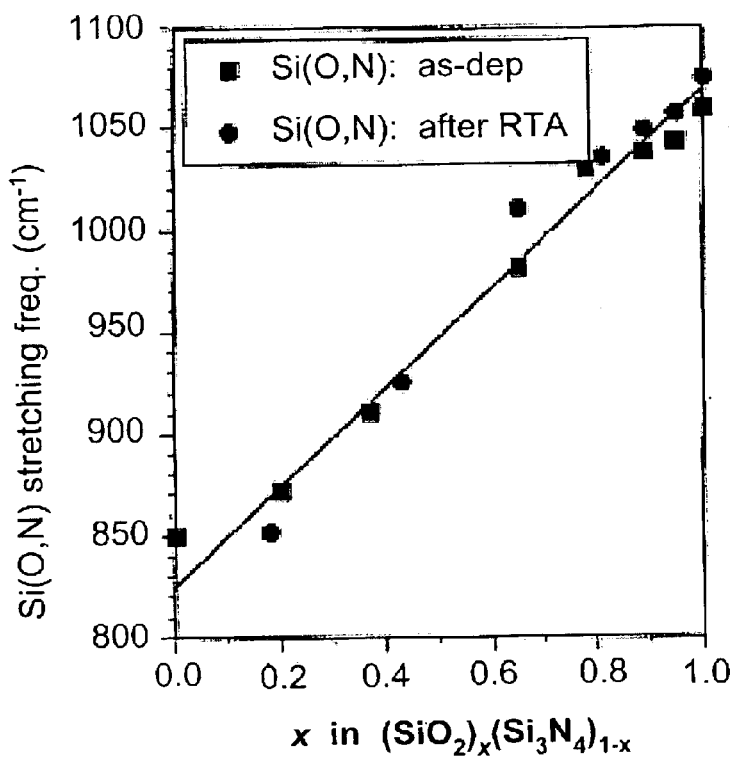
FIG. 4 is a plot of the Si—(O,N) stretching peak position as a function of the silicon nitride mole fraction in a silicon oxynitride film.

One method of assessing the silicon oxide to silicon nitride ratio is FTIR. FIG. 4 is a plot of the Si—(O,N) stretching peak position as a function of the silicon nitride mole fraction in a silicon oxynitride coating. There is a substantially linear relationship between the mole fraction and the peak position.

Figure 5:
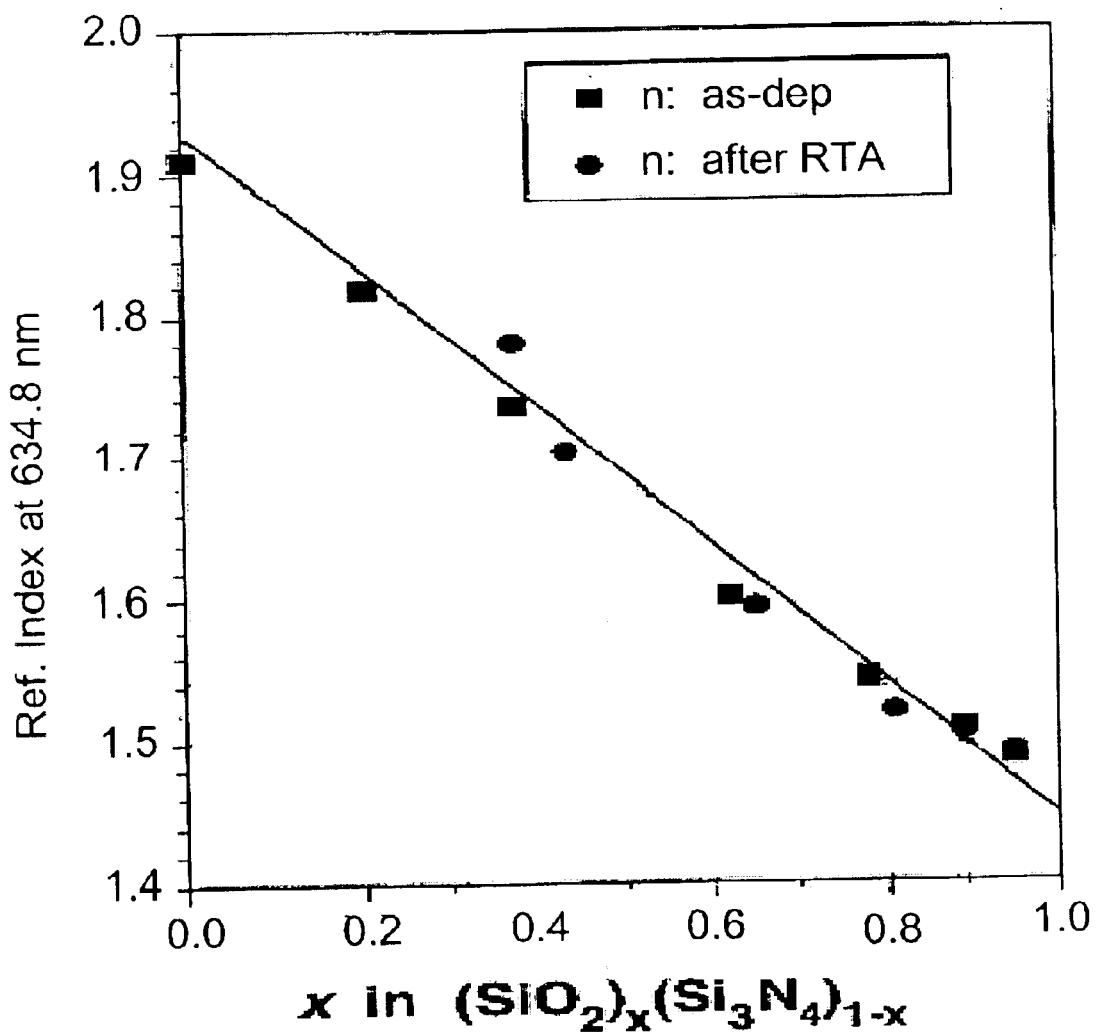
FIG. 5 is a plot of the relationship between refractive index at 634.8 nm and mole fraction silicon nitride in a silicon oxynitride film.

Another method of assessing the silicon oxide to silicon nitride ratio is a refractive index analysis. FIG. 5 shows the relationship between the refractive index of a silicon oxynitride film at 634.8 nm and mole fraction silicon nitride. The refractive index varies with mole fraction and this relationship is also substantially linear.

Figure 6:
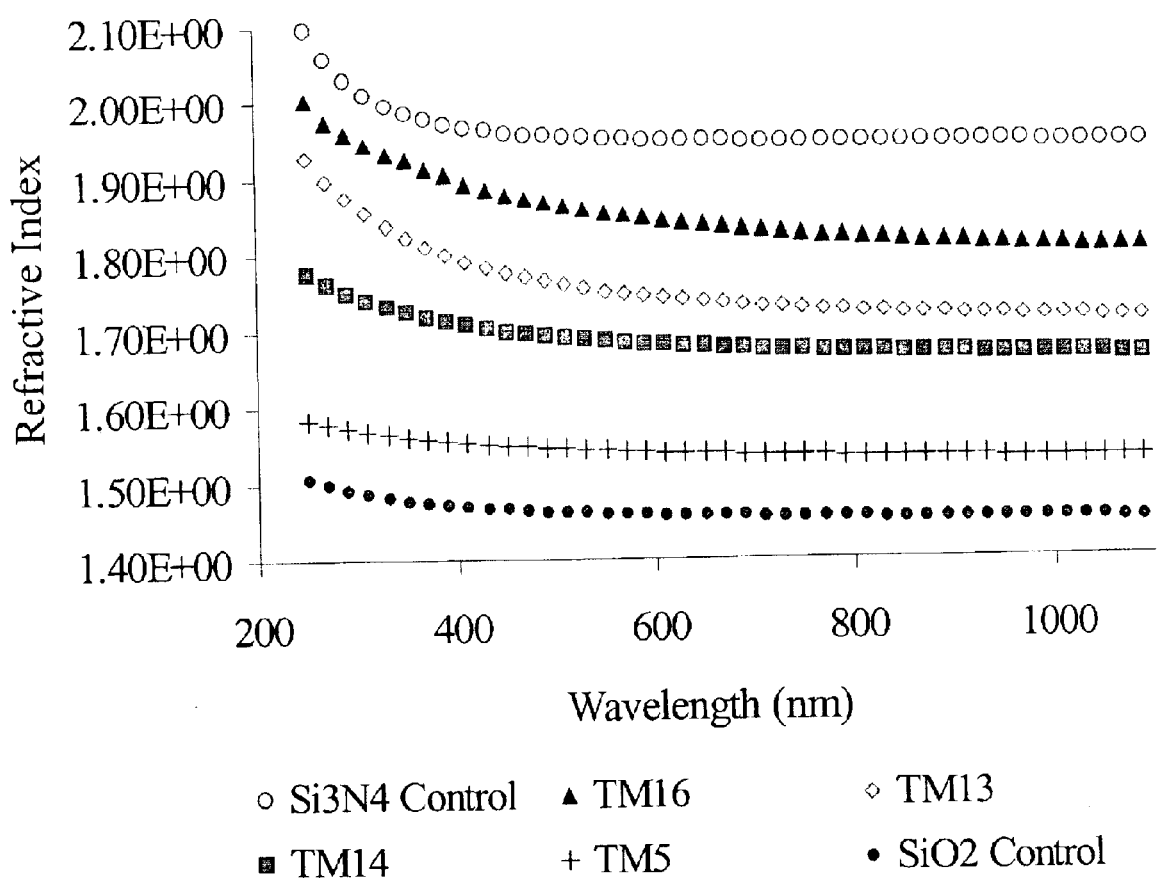
FIG. 6 is a plot of refractive index versus wavelength for silicon oxynitride films of varying composition.

The stoichiometry of the film can be assessed by any suitable method. One option uses FTIR and looks at the size of peaks corresponding to hydrogen bonds. A peak around 450 $cm^{-1}$ reflect the presence of Si—H bonds. A peak around 1300 $cm^{-1}$ reflects the presence of N—H bonds. Another method is to use two methods to assess the silicon oxide to silicon nitride ratio. If both methods are calibrated using stoichiometric films, a disparity between the two assessments is indicative of a non-stoichiometric film. The two methods can be, for example, FTIR and refractive index measurement, or the refractive index measured at two different wavelengths. A related third method looks at the shape of the refractive index versus wavelength curve. For a substantially stoichiometric film, the refractive index has little dependence on wavelength. For films that are not substantially stoichiometric, the refractive index generally shows a sharp rise as wavelengths approach 200 as illustrated by the curves labeled $Si_3N_4$, TM16, and TM13 in FIG. 6.

The stoichiometry is used to selectively modify silicon oxynitride film forming conditions with acts 305 and 307. The conditions apply to a process of forming films used in act 301. Any suitable process can be used. An exemplary process is remote plasma deposition.

Remote plasma deposition involves flowing gases through a chamber containing the substrate(s) on which the film is to be deposited. In one part of the chamber, the gases are ionized. Ionized gas convects and diffuses to substrate surfaces on which the ionized gas deposit to form the film.

Generally, three source gases are used to deposit a silicon oxynitride film: A silicon source gas, an oxygen source gas, and a nitrogen source gas. The silicon source gas contains a silicon compound, such as $SiH_4$. Additional examples of silicon compounds include halosilanes and silanes, such as $SiF_4$, $SiCl_4$, $SiCl_3H$, $SiCl_2H_2$, $SiClH_3$, alkyl silanes, siloxanes, silanols, and silazanes. The oxygen source gas contains an oxygen compound, such as $O_2$, $O_3$, $N_2O$, NO, or $NO_2$. The nitrogen source gas contains a nitrogen compound such as $N_2$ or $NH_3$.

As a rule, oxygen compounds deposit preferentially over nitrogen compounds. To achieve a balance between the deposition rates, the oxygen concentration in the gas is kept low. The concentrations are controlled through the feed gas flow rates (and to a lesser extent, the exhaust gas flow rate). Due to the high reaction rate of oxygen compounds and the limited precision of flow control devices, the oxygen compound is generally diluted in the feed. In a preferred embodiment, the silicon source gas is $SiH_4$, the oxygen source gas is 1% $N_2O$ in $N_2$, and the nitrogen source gas is $N_2$. As an example, these gases can be provided in a ratio of 1:10:10. Other process conditions for this example are 300 mTorr pressure, 300° C. temperature, and 300 Watts of power to ionize the gases. Due to variations among deposition chambers and substrates, some adjustment of these conditions may be required.

The flow rate ratio between the nitrogen source gas and the oxygen source gas can be adjusted as needed to achieve a desired silicon nitride to silicon oxide ratio. Increasing the flow rate of the nitrogen source gas relative to the oxygen source gas increases the silicon nitride fraction. Decreased the flow rate of the nitrogen source gas relative to the oxygen source gas decreases the silicon nitride fraction.

The stoichiometry of the film is improved by adjusting the ratio of the silicon source gas to the other gases. For example, when an FTIR spectrum shows a significant peak near 450, reducing the silicon source gas flow rate will reduce the size of the peak in further samples. When an FTIR spectrum shows a significant peak near 1300, increasing the silicon source gas flow rate will reduce the size of the peak and improve the stoichiometry.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary, Components described in functional terms have structure and involve acts, unless otherwise indicated, corresponding to any of the devices and methods known to those of ordinary skill in the art to perform those functions, even though not equivalent to any of the structures and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

What is claimed is:

1. A method of manufacturing flash memory devices having a silicon oxynitride charge trapping dielectric, comprising:

forming a first silicon oxynitride coating using a first set of processing conditions, wherein the first silicon oxynitride coating is represented by the formula $\zeta_y((Si_3N_4)_x(SiO_2)_{(1-x)})_{1-y}$ wherein $\zeta$ represents all atoms that cannot be fit into the formula $(Si_3N_4)_x(SiO_2)_{(1-x)}$;

assessing a stoichiometry of the silicon oxynitride by determining a first value of y in the formula $\zeta_y((Si_3N_4)_x(SiO_2)_{(1-x)})_{1-y}$;

selectively adjusting the first set of processing conditions to provide a second set of processing conditions that are directed towards obtaining a more stoichiometric silicon oxynitride having a value of y in the formula $\zeta_y((Si_3N_4)_x(SiO_2)_{(1-x)})_{1-y}$ that is lower than the first value of y; and forming a second silicon oxynitride coating using the second set of processing conditions.

2. The method of claim 1, wherein selectively adjusting the first set of processing conditions to provide a second set of processing conditions comprises developing a process for manufacturing a silicon oxynitride coating in flash memory devices to obtain a more stoichiometric silicon oxynitride using the second set of processing conditions.

3. The method of claim 1, wherein forming a second silicon oxynitride coating using the second set of processing conditions comprises controlling a process for manufacturing the second silicon oxynitride coating in flash memory devices using the second set of processing conditions.

4. The method of claim 1, wherein assessing the stoichiometry of the silicon oxynitride comprises determining a silicon oxide to silicon nitride ratio of the first silicon oxynitride using FTIR.

5. The method of claim 4, wherein the first silicon oxynitride contains hydrogen and the process conditions are selectively adjusted to provide less hydrogen in the second silicon oxynitride.

6. The method of claim 1, wherein assessing the stoichiometry of the silicon oxynitride comprises measuring a refractive index of the first silicon oxynitride at two or more wavelengths.

7. The method of claim 6, wherein the first silicon oxynitride contains hydrogen and the process conditions are selectively adjusted to provide less hydrogen in the second silicon oxynitride.

8. The method of claim 1, further comprising assessing the ratio between silicon oxide and silicon nitride in the first silicon oxynitride.

9. The method of claim 8, wherein the second set of processing conditions are further directed towards obtaining a silicon oxynitride having a silicon oxide to silicon nitride ratio closer to a predetermined silicon oxide to silicon nitride ratio than the first silicon oxynitride.

10. The method of claim 1, wherein assessing the stoichiometry of the silicon oxynitride comprises:

assessing a first silicon oxide to silicon nitride ratio of the silicon oxynitride using an FTIR technique; and assessing a second silicon oxide to silicon nitride ratio of the silicon oxynitride using a refractive index technique;

wherein selectively adjusting the first set of processing conditions to provide a second set of processing conditions comprises adjusting the first set of processing conditions if a disparity exists between the first and second ratios.

11. A method of manufacturing a flash memory device, comprising:

forming a silicon oxynitride film over a semiconductor substrate using remote plasma deposition, wherein the silicon oxynitride film serves as a charge trapping dielectric;

forming a gate over the silicon oxynitride film; and forming source/drain regions in the semiconductor substrate and defining a channel therebetween, wherein the channel resides under the silicon oxynitride film and the gate, wherein the silicon oxynitride charge trapping dielectric has silicon-oxygen, silicon-nitrogen, and silicon-hydrogen bonds, and wherein a ratio of silicon-hydrogen bonds to combined silicon-oxygen and silicon-nitrogen bonds is 1:15 or less.

12. The method of claim 11, wherein the ratio is 1:50 or less.

13. The method of claim 11, wherein the ratio is 1:100 or less.

14. A method of manufacturing a flash memory device, comprising:

forming a silicon oxynitride film over a semiconductor substrate, wherein the silicon oxynitride film serves as a charge trapping dielectric;

forming a gate over the silicon oxynitride film; and forming source/drain regions in the semiconductor substrate and defining a channel therebetween, wherein the channel resides under the silicon oxynitride film and the gate, wherein the silicon oxynitride charge trapping dielectric has a silicon nitride content of about 20% or more and about 95% or less on a mole basis.

15. The method of claim 14, wherein the silicon oxynitride charge trapping dielectric has a silicon nitride content of about 40% or more and about 90% or less on a mole basis.

16. The method of claim 14, wherein the silicon oxynitride charge trapping dielectric has a silicon nitride content of about 60% or more and about 80% or less on a mole basis.

17. A method of manufacturing a flash memory device, comprising:

forming a silicon oxynitride film over a semiconductor substrate, wherein the silicon oxynitride film serves as a charge trapping dielectric;

forming a gate over the silicon oxynitride film; and forming source/drain regions in the semiconductor substrate and defining a channel therebetween, wherein the channel resides under the silicon oxynitride film and the gate, wherein the silicon oxynitride charge trapping dielectric is represented by the formula $\zeta_y((Si_3N_4)_x(SiO_2)_{(1-x)})_{1-y}$, wherein $\zeta$ represents all atoms that cannot be fit to the formula $(Si_3N_4)_x(SiO_2)_{(1-x)}$, and wherein y is about 0.3 or less.

18. The method of claim 17, wherein y is about 0.1 or less.

19. The method of claim 17, wherein y is about 0.05 or less.

20. A method of manufacturing a flash memory device, comprising:

forming a silicon oxynitride film over a semiconductor substrate, wherein the silicon oxynitride film serves as a charge trapping dielectric;

forming a gate over the silicon oxynitride film; and forming source/drain regions in the semiconductor substrate and defining a channel therebetween, wherein the channel resides under the silicon oxynitride film and the gate, wherein the silicon oxynitride charge trapping dielectric has a ratio of Si—H and N—H bonds to Si—O and Si—N bonds of about 1:15 or less.

21. The method of claim 20, wherein the ratio of Si—H and N—H bonds to Si—O and Si—N bonds in the silicon oxynitride charge trapping dielectric is about 1:40 or less.

22. The method of claim 20, wherein the ratio of Si—H and N—H bonds to Si—O and Si—N bonds in the silicon oxynitride charge trapping dielectric is about 1:100 or less.

* * * * *